(12) United States Patent
Chang et al.

(10) Patent No.: US 8,866,211 B2
(45) Date of Patent: Oct. 21, 2014

(54) NONVOLATILE MEMORY DEVICE AND METHOD OF MANUFACTURING SAME

(75) Inventors: Dong-Ryul Chang, Suwon-si (KR); Myoung-Kyu Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 874 days.

(21) Appl. No.: 13/076,910

(22) Filed: Mar. 31, 2011

(65) Prior Publication Data

US 2011/0303961 A1    Dec. 15, 2011

(30) Foreign Application Priority Data

Jun. 11, 2010 (KR) ........................ 10-2010-0055663

(51) Int. Cl.
*H01L 29/788* (2006.01)
*H01L 27/115* (2006.01)

(52) U.S. Cl.
CPC .... *H01L 27/11521* (2013.01); *H01L 27/11519* (2013.01)
USPC ...................................... 257/316; 257/E29.3

(58) Field of Classification Search
USPC ............................................. 257/316, E29.3
See application file for complete search history.

(56) References Cited

U.S. PATENT DOCUMENTS

| 7,512,003 B2 | 3/2009 | Yoo et al. |
| 2008/0008003 A1 | 1/2008 | Yoo et al. |
| 2008/0080244 A1 | 4/2008 | Lee et al. |

FOREIGN PATENT DOCUMENTS

| JP | 2008-257804 | 10/2008 |
| KR | 10-0746292 | 7/2007 |

*Primary Examiner* — Marvin Payen
(74) *Attorney, Agent, or Firm* — Onello & Mello LLP

(57) ABSTRACT

A nonvolatile memory device including a cell array area in which a plurality of unit cells are arranged at least in one direction includes a plurality of memory transistors formed in the respective unit cells. Each memory transistor includes a gate pattern in which a tunnel insulating layer, a floating gate, an inter-gate insulating layer, and a control gate are laminated, and first and second junction areas arranged on opposite sides of the gate pattern, wherein the gate patterns are separated in the one direction by unit cells. The nonvolatile memory device also includes a first conduction interconnection which extends in the one direction and is arranged in a position that overlaps the control gate and a plurality of first contacts, at least one of which is arranged for each of the control gates to connect the control gates and the first conduction interconnection.

16 Claims, 14 Drawing Sheets

NONVOLATILE MEMORY DEVICE AND METHOD OF MANUFACTURING SAME

CROSS-REFERENCE TO RELATED APPLICATIONS

This application is based on and claims priority under 35 U.S.C. 119 to Korean Patent Application No. 10-2010-0055663, filed in the Korean Intellectual Property Office on Jun. 11, 2010, the entire contents of which are incorporated herein by reference.

BACKGROUND

1. Field of the Invention

The present inventive concept relates to a nonvolatile memory device, and more particularly to a nonvolatile memory device having a structure requiring a reduced number of processing steps, and a method of manufacturing the same.

2. Description of the Prior Art

Nonvolatile memory devices retain stored information even though the external power supply to the device is interrupted. An example of such a nonvolatile memory is an EEPROM (Electrically Erasable Programmable Read Only Memory). In an EEPROM device, charge is stored in a floating gate after passing through a thin insulating layer, i.e., a tunnel oxide layer, comprising an insulating material such as $SiO_2$, by a Fowler-Nordheim tunneling phenomenon. A transistor is turned on or off depending upon the amount of the stored charge.

Types of EEPROM devices include a 1-transistor type memory device and a 2-transistor type memory device. In a 1-transistor type memory device, data can be erased from the device in units of blocks. In a 2-transistor type memory device, data can be erased from the device in units of bytes. In the 1-transistor type EEPROM, a unit memory cell includes a memory transistor for storing data. In the 2-transistor type EEPROM, a unit memory cell includes a select transistor for selecting a cell and a memory transistor for storing data.

The memory transistor typically includes a floating gate separated by unit cells to store charge, and a control gate connected between unit cells to be used as one line, i.e., a sense line, and receiving a predetermined voltage for programming and/or erasing.

Since the structure of the memory transistor includes floating gate and a control gate, a photo etching process is required at least twice to form a gate of the memory transistor. That is, the gate of the memory transistor is formed through a series of processes including a first conduction layer forming process for the floating gate, a primary photo etching process with respect to the first conduction layer for separating the floating gate by unit cells, an inter-gate insulating layer forming process, a second conduction layer forming process for the control gate, and a secondary photo etching process with respect to the second conduction layer, the inter-gate insulating layer, and the first conduction layer. The primary and secondary photo etching processes are required.

Since the photo etching process is required at least twice in forming the gate of the memory transistor, processing time and processing cost increase.

SUMMARY

Accordingly, the present inventive concept provides a nonvolatile memory device having a structure that can reduce processing steps.

Additional advantages and features of the inventive concept will be set forth in part in the description which follows and in part will become apparent to those having ordinary skill in the art upon examination of the following or may be learned from practice of the inventive concept.

According to one aspect, the inventive concept is directed to a nonvolatile memory device including a cell array area where a plurality of unit cells is arranged at least in one direction. The nonvolatile memory device includes a plurality of memory transistors formed in respective unit cells. Each memory transistor includes a gate pattern in which a tunnel insulating layer, a floating gate, an inter-gate insulating layer, and a control gate are laminated, and first and second junction areas arranged on opposite sides of the gate pattern, wherein the gate patterns are separated in the one direction by unit cells. The nonvolatile memory device further includes a first conduction interconnection which extends in the one direction and is arranged in a position that overlaps the control gate and a plurality of first contacts at least one of which is arranged for each of the control gates to connect the control gates and the first conduction interconnection.

In some embodiments, the floating gate and the control gate are patterned in the same photo-etching process.

In some embodiments, at least one of the floating gate and the control gate includes polysilicon.

In some embodiments, at least one of the first conduction interconnection and the first contact includes metal.

According to another aspect, the inventive concept is directed to a nonvolatile memory device including a cell array area in which a plurality of unit cells is arranged at least in one direction. The nonvolatile memory device includes a plurality of memory transistors formed in respective unit cells, each memory transistor including a first gate pattern in which a tunnel insulating layer, a floating gate, an inter-gate insulating layer, and a control gate are laminated, a first junction area and a second junction area, the first and second junction areas being arranged on opposite sides, respectively, of the first gate pattern, wherein the gate patterns of the memory transistors are separated in the one direction by unit cells. The nonvolatile memory device also includes a plurality of selection transistors formed in respective unit cells, each selection transistor including a second gate pattern which extends in the one direction apart for a predetermined distance from the first gate pattern in a direction that crosses the one direction and in which a gate insulating layer and a conduction layer pattern are laminated, the second junction area and a third junction area being arranged on opposite sides of the second gate pattern. The nonvolatile memory device also includes a first conduction interconnection which extends in the one direction and is arranged in a position that overlaps the control gate. The nonvolatile memory device also includes a plurality of first contacts, at least one of said first contacts being arranged for each of the control gates to connect the control gates and the first conduction interconnection.

In some embodiments, the floating gate and the control gate are patterned in the same photo-etching process.

In some embodiments, at least one of the floating gate and the control gate includes polysilicon.

In some embodiments, at least one of the first conduction interconnection and the first contact includes metal.

In some embodiments, the conduction layer pattern of the second gate pattern includes a laminated structure of a first conduction layer pattern, an inter-gate insulating layer pattern, and a second conduction layer pattern, which correspond to the floating gate, the inter-gate insulating layer, and the control gate of the first gate pattern, respectively.

In some embodiments, the nonvolatile memory device further includes: a second conduction interconnection extending in the one direction and arranged in positions that overlap the second gate patterns; and a second contact connecting the second conduction interconnection to the first conduction layer pattern of the second gate pattern.

In some embodiments, the nonvolatile memory device further includes a third contact connecting the first junction area to a bit line.

According to another aspect, the inventive concept is directed to a nonvolatile memory device including a cell array area in which a plurality of unit cells is arranged at least in one direction. The nonvolatile memory device includes a plurality of memory transistors formed in respective unit cells, each memory transistor including a first gate pattern in which a tunnel insulating layer, a floating gate, an inter-gate insulating layer, and a control gate are laminated, a first junction area and a second junction area, the first and second junction areas being arranged on opposite sides, respectively, of the first gate pattern, wherein the gate patterns of the memory transistors are separated in the one direction by unit cells. The nonvolatile memory device also includes a plurality of selection transistors formed in respective unit cells, each selection transistor including a second gate pattern which extends in the one direction apart for a predetermined distance from the first gate pattern in a direction that crosses the one direction and in which a gate insulating layer and a conduction layer pattern are laminated, the second junction area and a third junction area being arranged on opposite sides of the second gate pattern, wherein the conduction layer pattern of the second gate pattern includes a laminated structure of a first conduction layer pattern, an inter-gate insulating layer pattern, and a second conduction layer pattern, which correspond to the floating gate, the inter-gate insulating layer, and the control gate of the first gate pattern, respectively. The nonvolatile memory device also includes a first conduction interconnection which extends in the one direction and is arranged in a position that overlaps the control gate. The nonvolatile memory device also includes a plurality of first contacts, at least one of said first contacts being arranged for each of the control gates to connect the control gates and the first conduction interconnection. The nonvolatile memory device also includes a second conduction interconnection extending in the one direction and arranged in positions that overlap the second gate patterns. The nonvolatile memory device also includes a second contact connecting the second conduction interconnection to the first conduction layer pattern of the second gate pattern.

In some embodiments, the floating gate and the control gate are patterned in the same photo-etching process.

In some embodiments, at least one of the floating gate and the control gate includes polysilicon.

In some embodiments, at least one of the first conduction interconnection and the first contact includes metal.

In some embodiments, the nonvolatile memory device further includes a third contact connecting the first junction area to a bit line.

Other detailed items of the present inventive concept are included in the detailed description and drawings.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

DETAILED DESCRIPTION OF THE EMBODIMENTS

Figure 1:
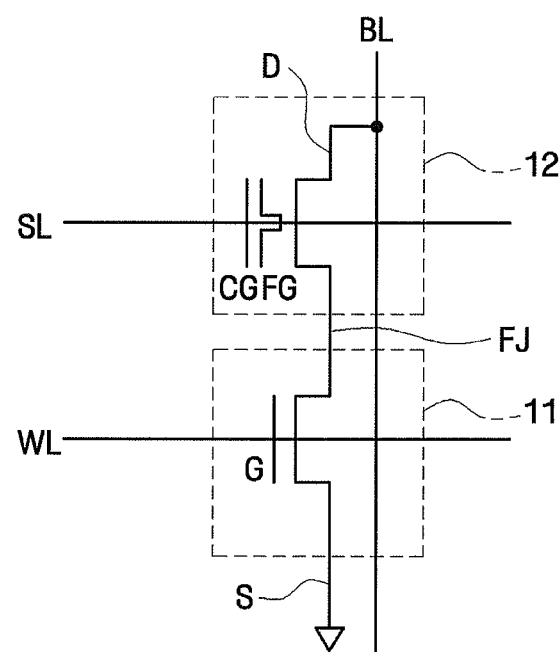
FIG. 1 is a schematic equivalent circuit diagram of a nonvolatile memory device according to an embodiment of the present inventive concept.

Hereinafter, preferred embodiments of the present inventive concept will be described in detail with reference to the accompanying drawings. The aspects and features of the present inventive concept and methods for achieving the aspects and features will be apparent by referring to the embodiments described in detail herein with reference to the accompanying drawings.

The term "on" that is used to designate that an element is on another element located on a different layer or a layer includes both a case where an element is located directly on another element or a layer and a case where an element is located on another element via another layer or still another element. In contrast, the term "directly on" means that an element is directly on another element or a layer without intervention of any other element or layer. In the entire description of the present inventive concept, the same drawing reference numerals are used for the same elements across various figures. Also, the term "and/or" includes the respective described items and combinations thereof.

Spatially relative wordings "below", "beneath", "lower", "above", "upper", and so forth, as illustrated in the drawings, may be used to facilitate the description of relationships between an element or constituent elements and another element or other constituent element. The spatially relative wordings should be understood as wordings that include different directions of the element in use or operation in addition to the direction illustrated in the drawings. In the entire description of the present inventive concept, the same drawing reference numerals are used for the same elements across various figures.

In the following description of the present inventive concept, embodiments of the present inventive concept will be described with reference to plane views and sectional views which are ideal schematic views. The form of exemplary views may be modified due to the manufacturing techniques and/or allowable errors. Accordingly, the embodiments of the present inventive concept are not limited to their specified form as illustrated, but include changes in form being produced according to manufacturing processes.

Hereinafter, embodiments of the present inventive concept will be described using a 2-transistor type EEPROM as an example. However, it will be apparent to those skilled in the art that the present inventive concept can be applied to all nonvolatile memory devices provided with memory transistors that include floating gates and control gates.

FIG. 1 is a schematic equivalent circuit diagram of a nonvolatile memory device, specifically, a unit cell of a nonvolatile memory device, according to an embodiment of the present inventive concept.

Referring to FIG. 1, a unit cell according to an embodiment of the present inventive concept includes two transistors, namely, a selection transistor 11 for selecting a cell and a memory transistor 12 for storing data.

The selection transistor 11 includes a floating junction area FJ, a source area S, and a gate G. In one particular exemplary embodiment, the gate G of the selection transistor 11 is connected to a word line WL. The selection transistor 11 is connected to the memory transistor 12 through the floating junction area FJ.

The memory transistor 12 includes a drain area D, a floating junction area FJ, a floating gate FG, and a control gate CG. In one particular exemplary embodiment, the control gate CG of the memory transistor 12 is connected to a sense line SL, and the drain area D is connected to a bit line BL.

Cell erasing and programming operations of the nonvolatile memory device as described above will be described. Cell erasing is performed such that a threshold voltage of the memory transistor is increased by injecting electrons into the floating gate FG through application of, in one particular exemplary embodiment, 13 to 20V to the sense line SL and the word line WL, 0V to the bit line BL, and a voltage which places the source area S in a floating state or at 0V to the source area 5, respectively. Cell programming is performed such that the threshold voltage of the memory transistor is decreased by discharging electrons in the floating gate FG through application of, in one particular exemplary embodiment, 0V to the sense line and 13 to 20V to the bit line BL and the word line WL, respectively, and placing the source area S in a floating state.

As described above, a plurality of unit cells is arranged in the form of a matrix to form a cell array area of a nonvolatile memory device according to an embodiment of the present inventive concept. Hereinafter, with reference to the drawings illustrating a cell array area, the structure of a nonvolatile memory device and a method of manufacturing the same according to an embodiment of the present inventive concept will be described.

FIGS. 2A to 7C are views illustrating a manufacturing method and the structure of a nonvolatile memory device according to exemplary embodiments of the present inventive concept. Specifically, FIGS. 2A, 3A, 4A, 5A, 6A, and 7A are plan views, FIGS. 2B, 3B, 4B, 5B, 6B, and 7B are sectional views taken along lines A-A' of FIGS. 2A, 3A, 4A, 5A, 6A, and 7A, respectively, and FIGS. 2C, 3C, 4C, 5C, 6C, and 7C are sectional views taken along lines B-B' of FIGS. 2A, 3A, 4A, 5A, 6A, and 7A, respectively.

Referring to FIGS. 2A to 7C, a method of manufacturing a nonvolatile memory device according to an embodiment of the present inventive concept will be described.

Figure 2A:
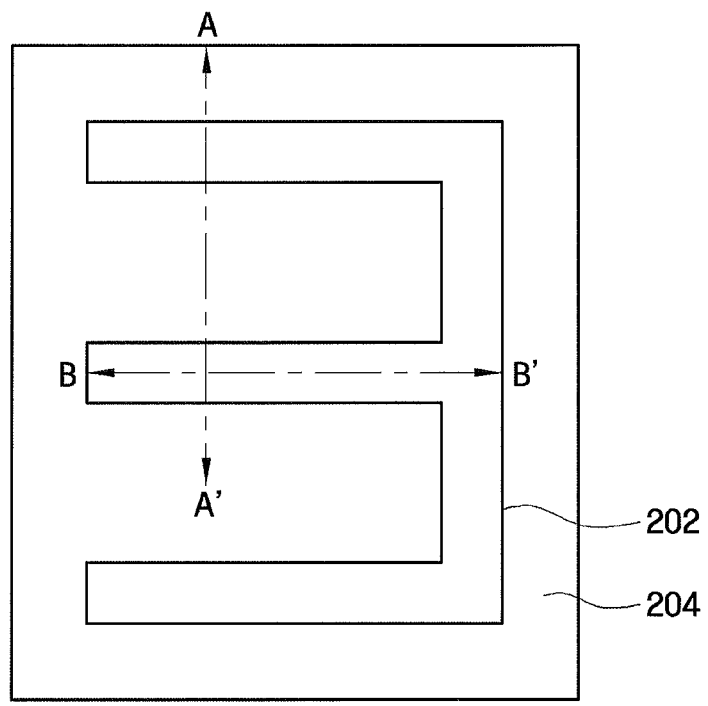
FIGS. 2A, 3A, 4A, 5A, 6A and 7A are schematic plan views illustrating a manufacturing method and the structure of a nonvolatile memory device, according to an to embodiment of the present inventive concept.
Figure 2B:
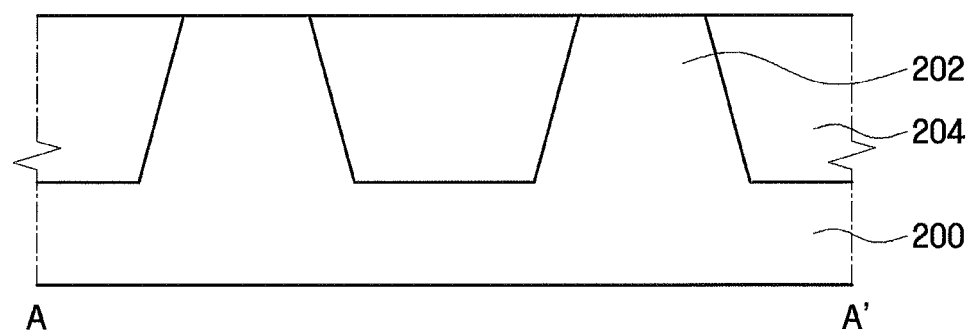
FIGS. 2B, 3B, 4B, 5B, 6B and 7B are schematic cross-sectional views taken along lines A-A' of FIGS. 2A, 3A, 4A, 5A, 6A and 7A, respectively.
Figure 2C:
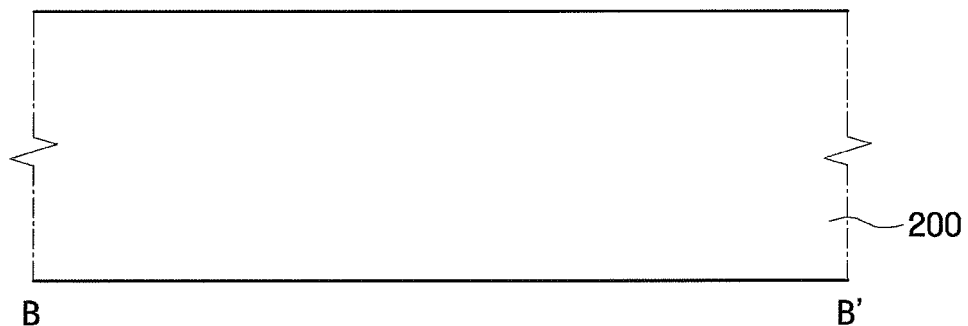
FIGS. 2C, 3C, 4C, 5C, 6C and 7C are schematic cross-sectional views taken along lines B-B' of FIGS. 2A, 3A, 4A, 5A, 6A and 7A, respectively.

Referring to FIGS. 2A, 2B and 2C, an active area 202 of a semiconductor substrate 200 is defined by forming an isolation layer 204 on the semiconductor substrate 200. In one particular exemplary embodiment, the isolation layer 204 is formed by an STI (Shallow Trench Isolation) process, and may be made of an insulating layer such as an oxide layer or the like.

Figure 3A:
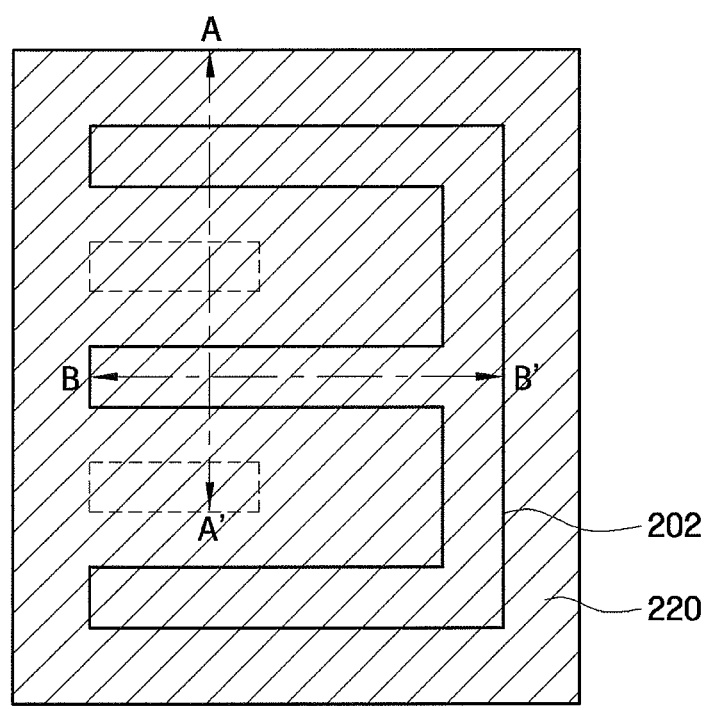
Figure 3B:
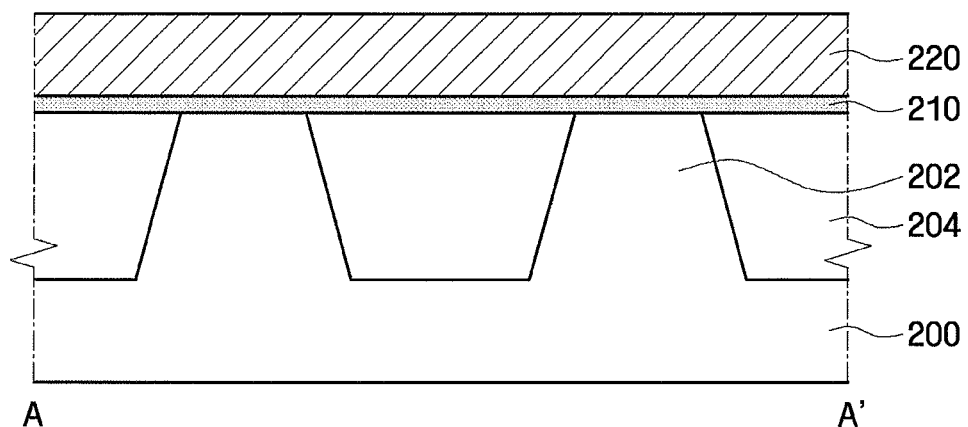
Figure 3C:
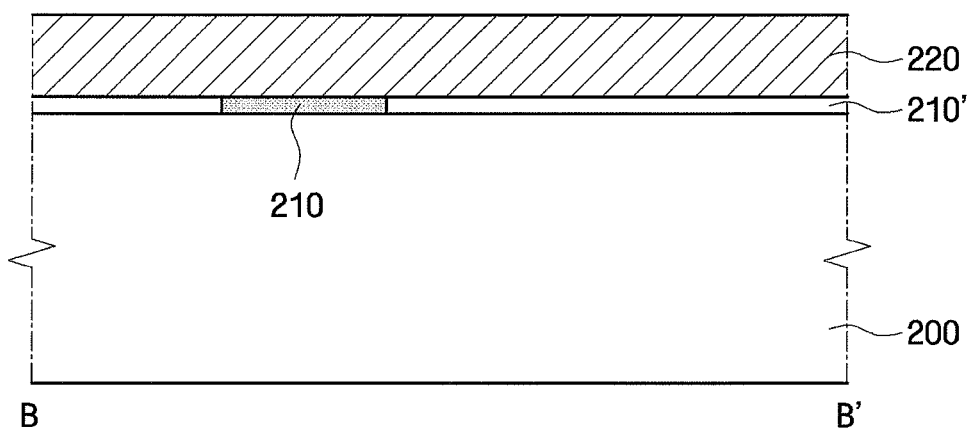

Referring to FIGS. 3A, 3B and 3C, a tunnel insulating layer 210 and a gate insulating layer 210' are formed on the semiconductor substrate 200 including the isolation layer 204.

More specifically, after the gate insulating layer 210' is formed on the semiconductor substrate 200, a portion of the semiconductor substrate 200 is exposed by etching the gate insulating layer 210' on an area where a memory transistor is to be formed, and a tunnel insulating layer 210 having a relatively thin thickness is grown onto the exposed semiconductor substrate 200. Accordingly, the tunnel insulating layer 210 is arranged in the area where the memory transistor is to be formed, and the gate insulating layer 210' is arranged in other areas. In some particular exemplary embodiments, the tunnel insulating layer 210 may be, for example, a $SiO_2$ layer or a SiON layer with a thickness of, for example, about 50 to about 70 Å, and the gate insulating layer 210' may be, for example, a $SiO_2$ layer with a thickness of about 300 to about 500 Å.

A first conduction layer 220 is formed on the tunnel insulating layer 210 and the gate insulating layer 210'. The first conduction layer 220 is to be used subsequently to form a floating gate, and for example, may be formed of polysilicon doped with impurities.

Figure 4A:
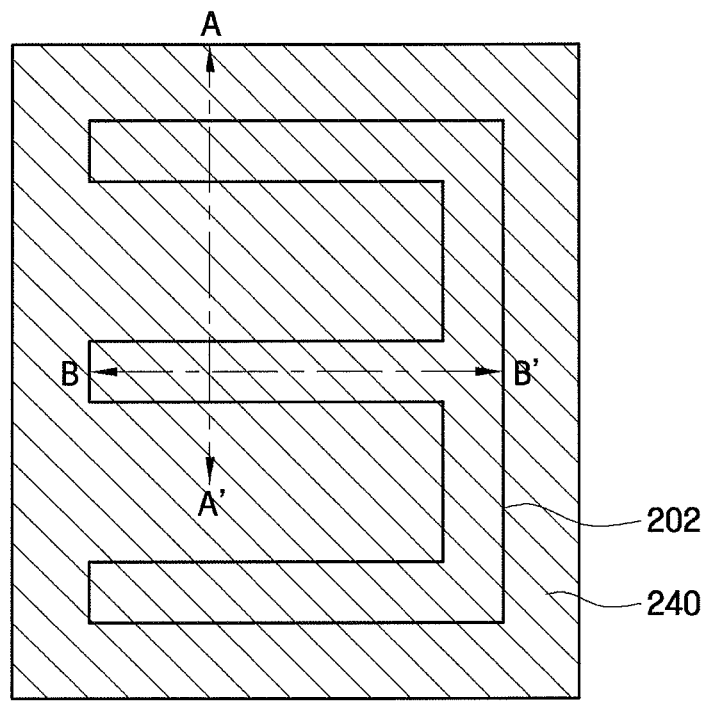
Figure 4B:
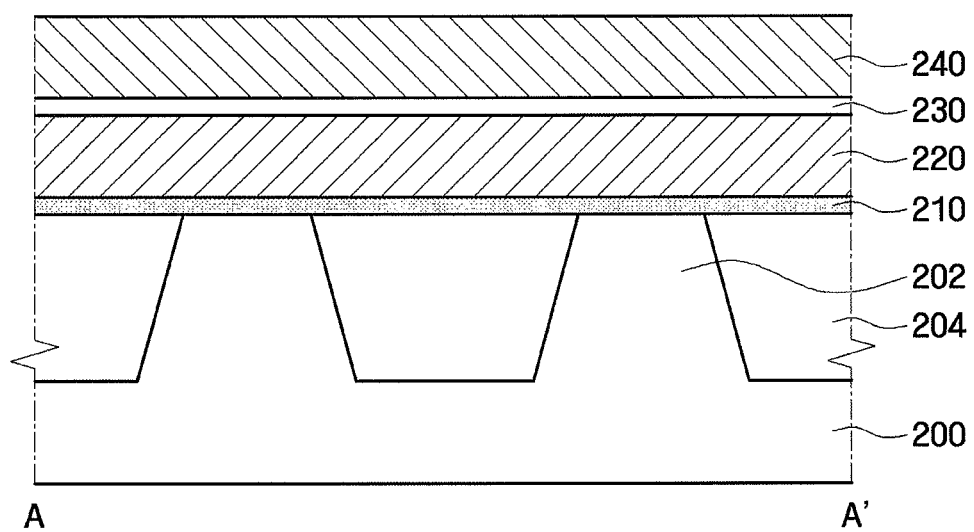
Figure 4C:
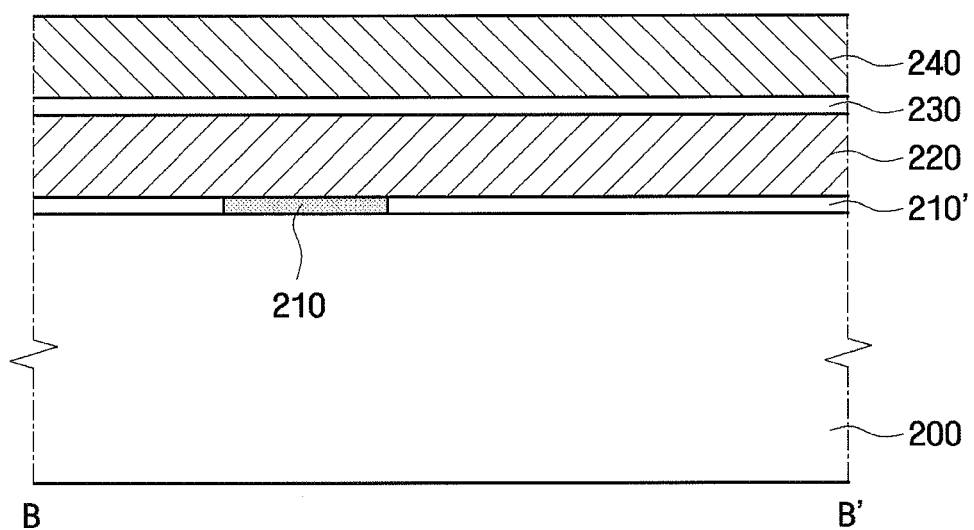

Referring to FIGS. 4A, 4B and 4C, an inter-gate insulating layer 230 and a second conduction layer 240 are sequentially formed on the first conduction layer 220.

The inter-gate insulating layer 230 provides insulation between the floating gate and the control gate, and may be formed of a single layer or a multi-layer such as ONO (Oxide-Nitride-Oxide) layers.

The second conduction layer 240 is to be used subsequently to form a control gate, and for example, may be formed of polysilicon doped with impurities.

In conventional processes, before the processes of the inventive concept illustrated in FIGS. 4A, 4B and 4C are performed and after the processes illustrated in FIGS. 3A, 3B and 3C are performed, the first conduction layer 220 is patterned by performing a photo-etching process in order to form the floating gate separated by unit cells. Specifically, the first conduction layer 220 that corresponds to the dotted area of FIG. 3A is etched.

In contrast, in accordance with this embodiment of the inventive concept, after the processes of FIGS. 3A, 3B and 3C are performed, the process of patterning the first conduction layer 220 is omitted, and the processes of FIGS. 4A, 4B and 4C are performed. That is, in this embodiment, a photo-etching process is omitted.

Figure 5A:
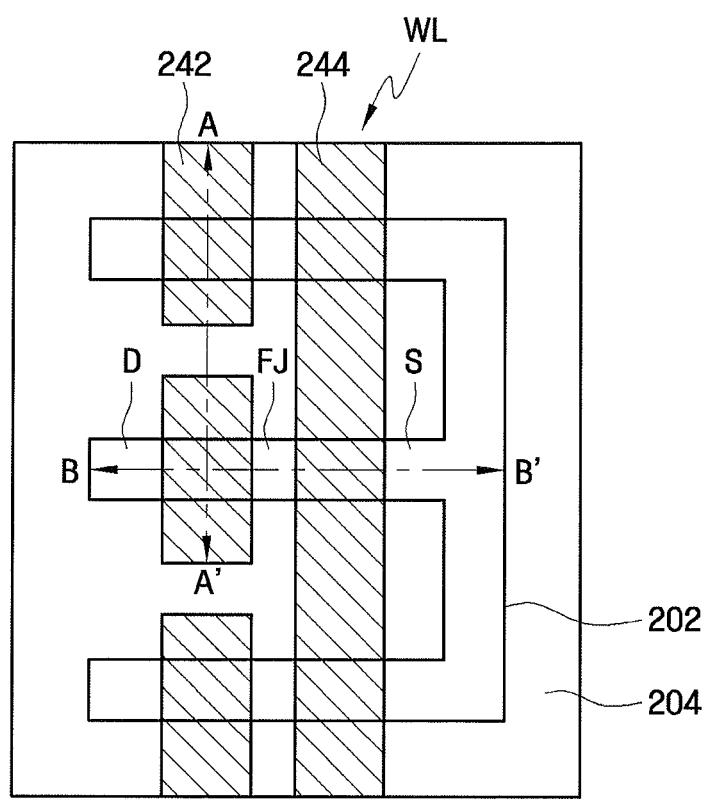
Figure 5B:
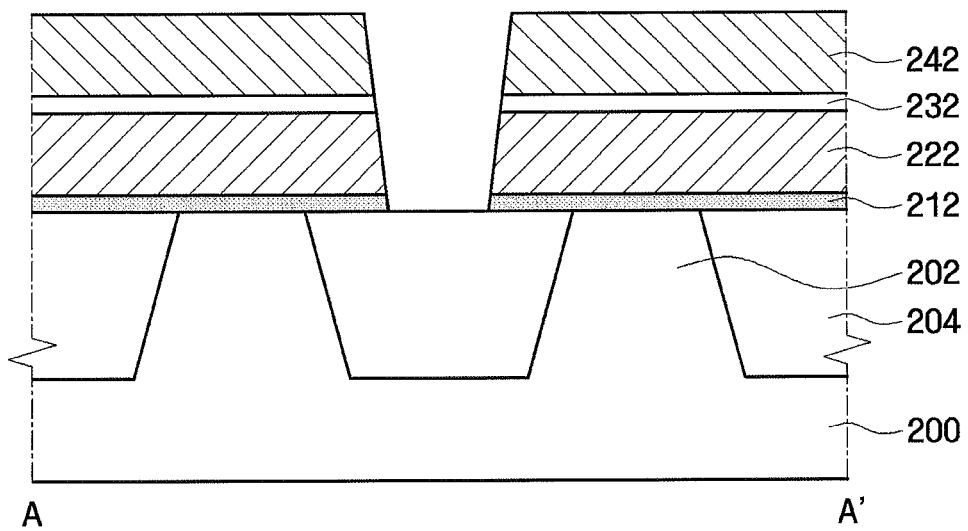
Figure 5C:
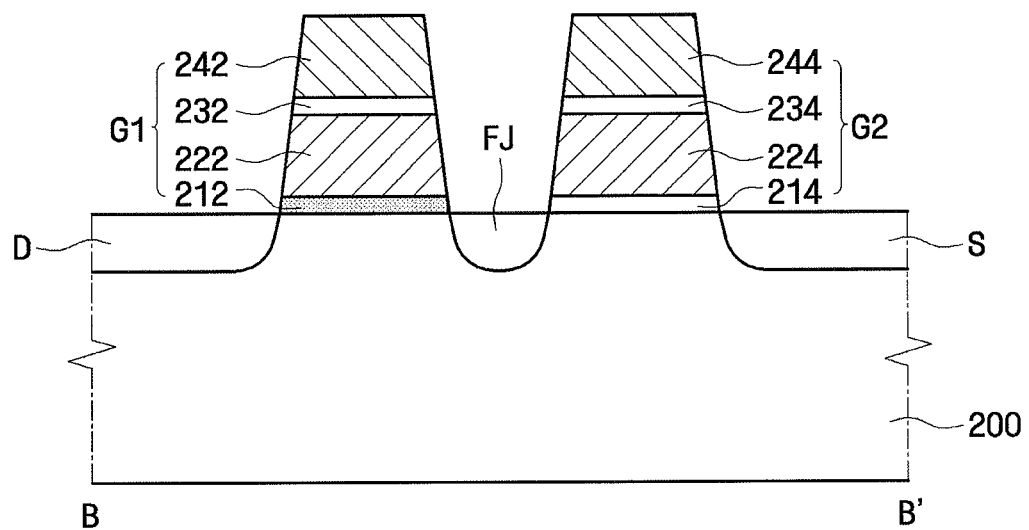

Referring to FIGS. 5A, 5B and 5C, a first gate pattern G1 of the memory transistor and a second gate pattern G2 of a select transistor are formed by patterning the second conduction layer 240, the inter-gate insulating layer 230, the first conduction layer 220, and the tunnel insulating layer 210 or the gate insulating layer 210' by a photo-etching process. That is, the first gate pattern G1 included in the memory transistor has a structure in which a tunnel insulating layer pattern 212, a floating gate 222, an inter-gate insulating layer pattern 232, and a control gate 242 are laminated. Also, the second gate pattern G2 included in the select transistor has a structure in which a gate insulating layer 214, a first conduction layer pattern 224, an inter-gate insulating layer pattern 234, and a second conduction layer pattern 244 are laminated, in a similar manner to the structure of the first gate pattern G1.

In this exemplary embodiment, the second gate pattern G2 is in the form of a line which extends in a first direction, e.g., vertical direction, to cross a plurality of active areas 202, and thus it is not separated by unit cells in the first direction. In this exemplary embodiment, the second gate pattern G2 is used as a word line WL.

In contrast, the first gate pattern G1 is positioned on a line which extends in the first direction that is parallel to the second gate pattern G2, is apart for a predetermined distance from the second gate pattern G2 in a second direction, e.g., horizontal direction, and is in the form of islands which are separated by unit cells in the first direction.

That is, in this exemplary embodiment, in contrast with conventional devices, not only the floating gate 222 but also the control gate 242 is in the form of islands which are separated by unit cells. This is because the floating gate 222 and the control gate 242 are patterned by the same photo-etching process. Since the control gate 242, which is to be used as a sense line of the memory transistor, is separated by unit cells as described above, a process for connecting the separated control gates 242 is used. This process for connecting the separated control gates 242 will be described in detail below with reference to FIGS. 6A, 6B, 6C, 7A, 7B and 7C.

Next, referring again to FIGS. 5A, 5B and 5C, a drain area D, a floating junction area FJ, and a source area S are formed by doping desired impurities into an active area 202 of the semiconductor substrate 200, which is exposed by the first gate pattern G1 and the second gate pattern G2. The floating junction area FJ is arranged between the first and second gate patterns G1 and G2, the drain area D is arranged on one side of the first gate pattern G1 in which the floating junction area FJ is not arranged, and the source area S is arranged on one side of the second gate pattern G2 in which the floating junction area FJ is not arranged.

Figure 6A:
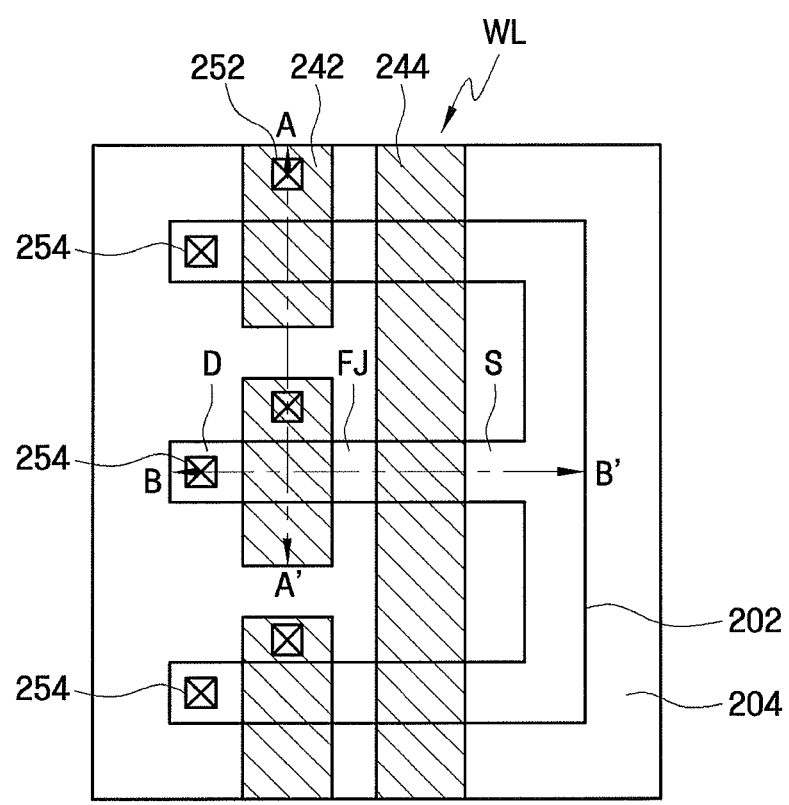
Figure 6B:
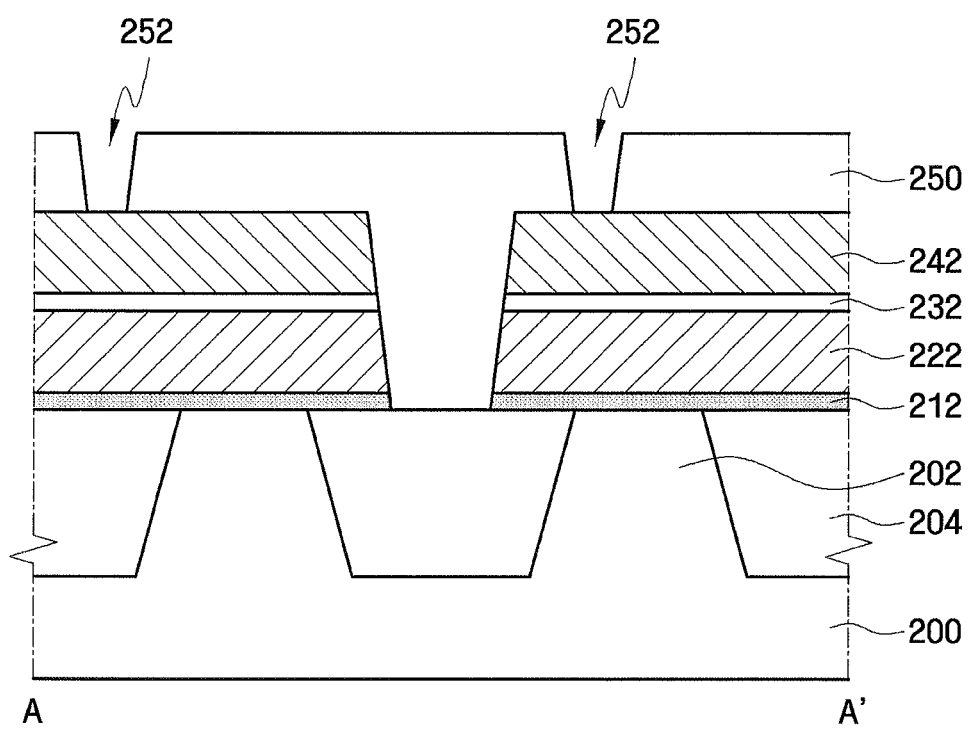
Figure 6C:
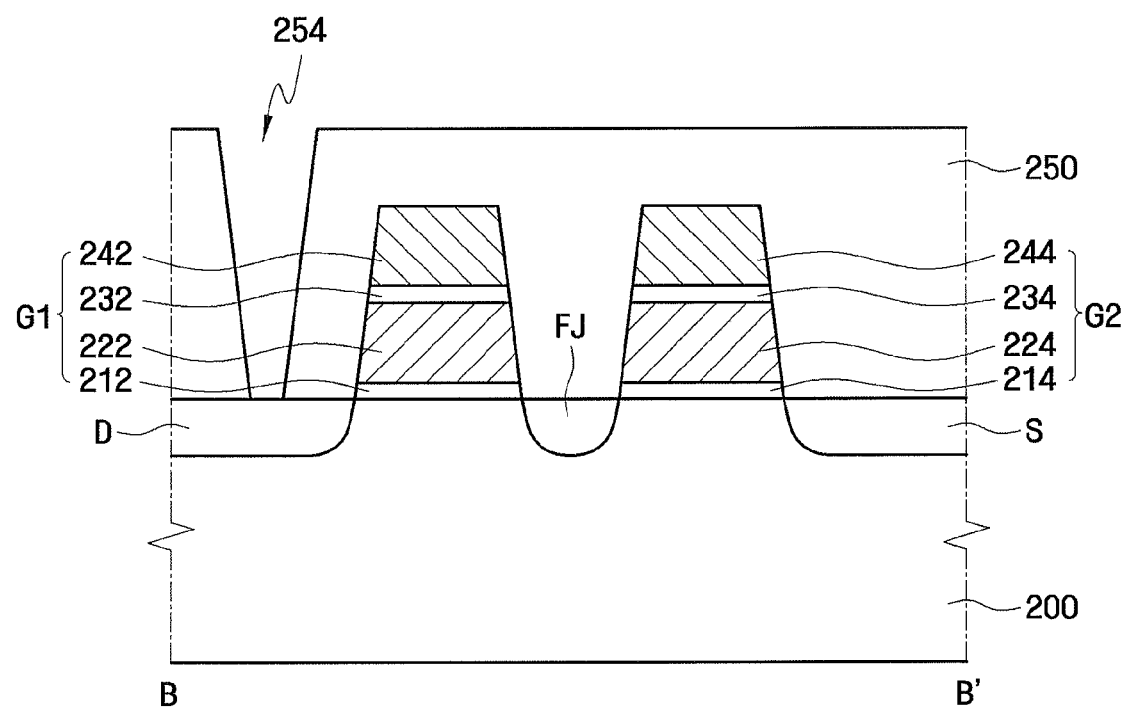

Referring to FIGS. 6A, 6B and 6C, gate spacers (not illustrated) are formed on side walls of the first and second gate patterns G1 and G2, and an inter-layer insulating layer 250 is formed on the whole resultant structure.

Contact holes for exposing a desired lower structure are formed by patterning the inter-layer insulating layer 250 by a photo-etching process. Specifically, first contact holes 252 for exposing a plurality of control gates 242 separated by unit cells are formed in this contact hole forming process. At least one of the first contact holes 252 should be arranged for each control gate 242. In the exemplary embodiment of FIG. 6A, the three first contact holes 252 are shown to be formed to expose three control gates 242, respectively. However, the present inventive concept is not limited to this configuration, and the number of the first contact holes 252 arranged for each control gate 242 may be different, and, in some embodiments, larger.

In the contact hole forming process, for example, second contact holes 254 for exposing the drain areas D may be formed. The second contact holes 254 may be connected to a bit line (not illustrated) in a subsequent process. Alternatively, although not illustrated in the drawing, contact holes for exposing the first conduction layer pattern 224 of the second gate pattern G2 may be formed at the ends of the second gate pattern G2 that is used as the word line WL.

That is, according to this embodiment of the inventive concept, since the plurality of first contact holes 252 for exposing the respective plurality of control gates 242 are formed together in the existing contact hole forming process, an additional photo-etching process for forming the first contact holes 252 is not required.

Figure 7A:
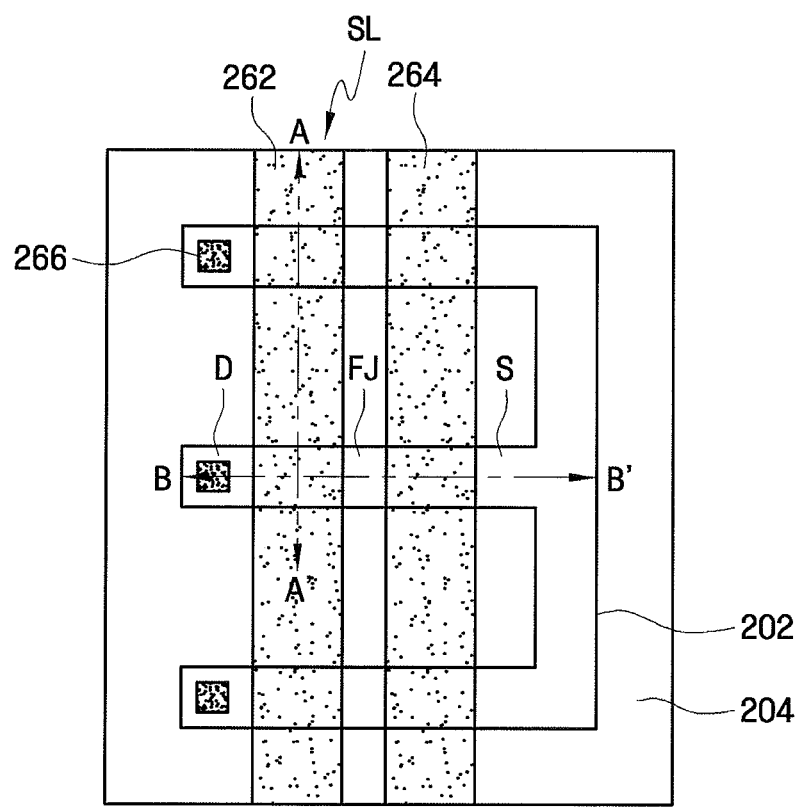
Figure 7B:
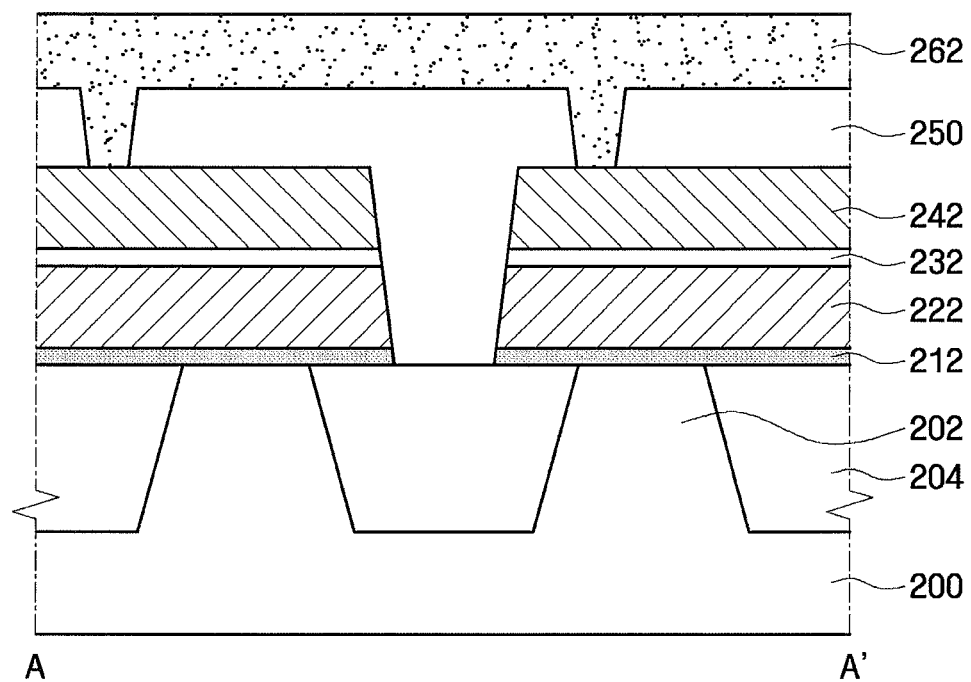
Figure 7C:
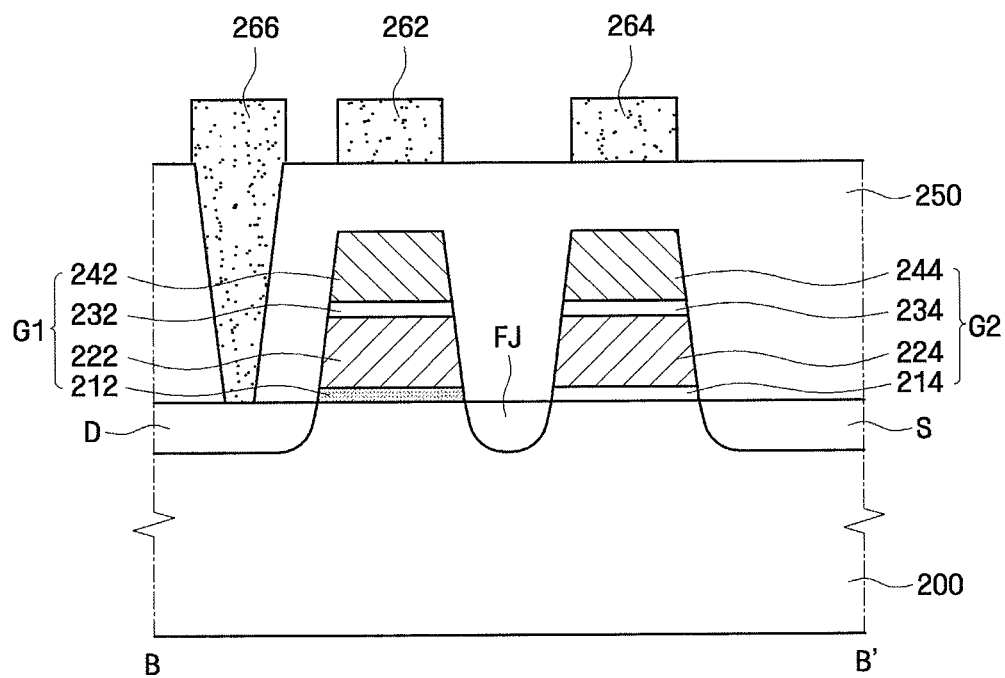

Referring to FIGS. 7A, 7B and 7C, a metal material with a predetermined thickness is formed on the inter-layer insulating layer 250 including the first and second contact holes 252 and 254 to fill in the first and second contact holes 252 and 254. A desired metal pattern is formed from the metal material by patterning the metal material. In particular, as illustrated in FIGS. 7A, 7B and 7C, a first metal interconnection 262 for connecting the plurality of control gates 242 separated by unit cells may be formed in the metal pattern forming process. In one exemplary embodiment, although not separately indicated in the drawings, the metal material that fills in the first contact hole 252 is referred to herein as a first metal contact in distinction with the first metal interconnection 262.

As described above, the first gate pattern G1 is positioned on the line that extends in the first direction parallel to the second gate pattern G2, and is in the form of islands is which are separated by unit cells in the first direction. The first metal interconnection 262 is formed to overlap the line. Since the first metal interconnection 262 is connected to the control gate 242 through the first contact hole 252, i.e., the first metal contact, the control gates 242 separated by unit cells are connected together through the first metal interconnection 262. That is, the control gate 242 may be used as the sense line SL of the memory transistor via the first metal interconnection 262.

In the metal pattern forming process, for example, a second metal interconnection 264 or a bit-line contact pad 266 may be formed together. In this exemplary embodiment, the second metal interconnection 264 is in the form of a line that overlaps the second gate pattern G2. The second metal interconnection 264 may be connected to the first conduction layer pattern 224 of the second gate pattern G2 through the metal material that fills in the contact hole (not illustrated) at the end of the second gate pattern G2, i.e., the metal contact (not illustrated), as described above, to lower the electric resistance. On the other hand, in this exemplary embodiment, the bit-line contact pad 266 may be connected to the drain area D through the metal material that fills in the second contact hole 254, i.e., the second metal contact, and may be connected to the bit line (not illustrated).

That is, in this exemplary embodiment, since the first metal interconnection 262 for connecting the control gates 242 separated by unit cells are formed together in the existing metal pattern forming process, an additional photo-etching process is not required.

Next, referring again to FIGS. 6A, 6B, 6C, 7A, 7B and 7C, the structure of a nonvolatile memory device according to an embodiment of the present inventive concept will be described.

Referring to FIGS. 6A, 6B, 6C and 7A, 7B, 7C, the memory device according to an embodiment of the present inventive concept includes a plurality of unit cells, each of which includes a select transistor and a memory transistor. In this exemplary embodiment, three unit cells are exemplified.

The memory transistor in the unit cell includes a first gate pattern G1, a drain area D, and a floating junction area FJ. The select transistor in the unit cell includes a second gate pattern G2, a source area S, and a floating junction area FJ.

Specifically, the first gate pattern G1 has a structure in which the tunnel insulating layer pattern 212, the floating gate 222, the inter-gate insulating layer pattern 232, and the control gate 242 are laminated, and the second gate pattern G2 has a structure in which the gate insulating layer 214, the first conduction layer pattern 224, the inter-gate insulating layer pattern 234, and the second conduction layer pattern 244 are laminated, in a similar manner to the structure of the first gate pattern G1.

In this exemplary embodiment, the second gate pattern G2 is formed to extend in the first direction, e.g., vertical direction, to cross a plurality of active areas 202, and is used as the word line WL.

In contrast, the first gate pattern G1 is positioned on the line which extends in the first direction, which is parallel to the second gate pattern G2, to cross the plurality of active areas 202, is apart for a predetermined distance from the second gate pattern G2 in the second direction, e.g., horizontal direction, and is in the form of islands which are separated by unit cells in the first direction.

Due to the shape of the first gate pattern G1 as described above, the control gates 242 of the first gate pattern G1 are also separated by unit cells, and are connected together between the unit cell by the metal material, i.e., the first metal contact, which fills in the first contact hole 252, at least one of which is arranged on the upper portion of the control gate 242, and the first metal interconnection 262 which is arranged on the upper portion of the first metal contact and extends in the first direction to cross the active area 202. Accordingly, the control gates 242 are used as the sense line SL.

As described above, according to the structure of the nonvolatile memory device and the method of manufacturing the same according to exemplary embodiments of the present inventive concept, since the floating gate and the control gate are patterned using the photo-etching process once, the processing steps are reduced in comparison to those in conventional processes, which perform the photo-etching process at least twice, i.e., the photo-etching process for separating the floating gate by unit cells and the photo-etching process for patterning the floating gate and the control gate.

Furthermore, through the photo-etching process that is performed only once, according to the inventive concept, the phenomenon that the control gate is separated by unit cells can be solved using the subsequent metal contact forming process and the metal interconnection forming process. Also, since the subsequent metal contact forming process and the metal interconnection forming process are necessary steps in order to manufacture the nonvolatile memory device in conventional devices, any separate processing step is not added. That is, only by adjusting the forming positions of the metal contact and the metal interconnection without adding any separate processing step, the control gates separated by unit cells can be connected together.

Although preferred embodiments of the present inventive concept have been described for illustrative purposes, those skilled in the art will appreciate that various modifications, additions and substitutions are possible, without departing from the scope and spirit of the inventive concept as defined by the accompanying claims.

What is claimed is:

1. A nonvolatile memory device including a cell array area in which a plurality of unit cells are arranged at least in one direction, the nonvolatile memory device comprising:
   a plurality of memory transistors formed in respective unit cells, each memory transistor including a gate pattern in which a tunnel insulating layer, a floating gate, an inter-gate insulating layer, and a control gate are laminated, and first and second junction areas arranged on opposite sides of the gate pattern, wherein the gate patterns are separated in the one direction by unit cells;
   a first conduction interconnection which extends in the one direction and is arranged in a position that overlaps the control gate; and
   a plurality of first contacts, at least one of said first contacts being arranged for each of the control gates to connect the control gates and the first conduction interconnection.

2. The nonvolatile memory device of claim 1, wherein the floating gate and the control gate are patterned in the same photo-etching process.

3. The nonvolatile memory device of claim 1, wherein at least one of the floating gate and the control gate includes polysilicon.

4. The nonvolatile memory device of claim 1, wherein at least one of the first conduction interconnection and the first contact includes metal.

5. A nonvolatile memory device including a cell array area in which a plurality of unit cells are arranged at least in one direction, the nonvolatile memory device comprising:
   a plurality of memory transistors formed in respective unit cells, each memory transistor including a first gate pattern in which a tunnel insulating layer, a floating gate, an inter-gate insulating layer, and a control gate are laminated, a first junction area and a second junction area, the first and second junction areas being arranged on opposite sides, respectively, of the first gate pattern, wherein the gate patterns of the memory transistors are separated in the one direction by unit cells;
   a plurality of selection transistors formed in respective unit cells, each selection transistor including a second gate pattern which extends in the one direction apart for a predetermined distance from the first gate pattern in a direction that crosses the one direction and in which a gate insulating layer and a conduction layer pattern are laminated, the second junction area and a third junction area being arranged on opposite sides of the second gate pattern;
   a first conduction interconnection which extends in the one direction and is arranged in a position that overlaps the control gate; and
   a plurality of first contacts, at least one of said first contacts being arranged for each of the control gates to connect the control gates and the first conduction interconnection.

6. The nonvolatile memory device of claim 5, wherein the floating gate and the control gate are patterned in the same photo-etching process.

7. The nonvolatile memory device of claim 5, wherein at least one of the floating gate and the control gate includes polysilicon.

8. The nonvolatile memory device of claim 5, wherein at least one of the first conduction interconnection and the first contact includes metal.

9. The nonvolatile memory device of claim 5, wherein the conduction layer pattern of the second gate pattern includes a laminated structure of a first conduction layer pattern, an inter-gate insulating layer pattern, and a second conduction layer pattern, which correspond to the floating gate, the inter-gate insulating layer, and the control gate of the first gate pattern, respectively.

10. The nonvolatile memory device of claim 9, further comprising:
    a second conduction interconnection extending in the one direction and arranged in positions that overlap the second gate patterns; and
    a second contact connecting the second conduction interconnection to the first conduction layer pattern of the second gate pattern.

11. The nonvolatile memory device of claim 5, further comprising a third contact connecting the first junction area to a bit line.

12. A nonvolatile memory device including a cell array area in which a plurality of unit cells are arranged at least in one direction, the nonvolatile memory device comprising:
    a plurality of memory transistors formed in respective unit cells, each memory transistor including a first gate pattern in which a tunnel insulating layer, a floating gate, an inter-gate insulating layer, and a control gate are laminated, a first junction area and a second junction area, the first and second junction areas being arranged on opposite sides, respectively, of the first gate pattern, wherein the gate patterns of the memory transistors are separated in the one direction by unit cells;

a plurality of selection transistors formed in respective unit cells, each selection transistor including a second gate pattern which extends in the one direction apart for a predetermined distance from the first gate pattern in a direction that crosses the one direction and in which a gate insulating layer and a conduction layer pattern are laminated, the second junction area and a third junction area being arranged on opposite sides of the second gate pattern, wherein the conduction layer pattern of the second gate pattern includes a laminated structure of a first conduction layer pattern, an inter-gate insulating layer pattern, and a second conduction layer pattern, which correspond to the floating gate, the inter-gate insulating layer, and the control gate of the first gate pattern, respectively;

a first conduction interconnection which extends in the one direction and is arranged in a position that overlaps the control gate;

a plurality of first contacts, at least one of said first contacts being arranged for each of the control gates to connect the control gates and the first conduction interconnection;

a second conduction interconnection extending in the one direction and arranged in positions that overlap the second gate patterns; and a second contact connecting the second conduction interconnection to the first conduction layer pattern of the second gate pattern.

13. The nonvolatile memory device of claim 12, wherein the floating gate and the control gate are patterned in the same photo-etching process.

14. The nonvolatile memory device of claim 12, wherein at least one of the floating gate and the control gate includes polysilicon.

15. The nonvolatile memory device of claim 12, wherein at least one of the first conduction interconnection and the first contact includes metal.

16. The nonvolatile memory device of claim 12, further comprising a third contact connecting the first junction area to a bit line.

\* \* \* \* \*